US012740321B2

(12) United States Patent
Hamano et al.

(10) Patent No.: US 12,740,321 B2
(45) Date of Patent: Sep. 15, 2026

(54) THERMOELECTRIC CONVERSION MODULE

(71) Applicant: Sinko Co., Ltd., Uonuma (JP)

(72) Inventors: Tetsutsugu Hamano, Fukuroi (JP); Takahiro Hayashi, Hamamatsu (JP)

(73) Assignee: SINKO CO., LTD., Uonuma (JP)

( * ) Notice: Subject to any disclaimer, the term of this patent is extended or adjusted under 35 U.S.C. 154(b) by 149 days.

(21) Appl. No.: 17/584,995

(22) Filed: Jan. 26, 2022

(65) Prior Publication Data

US 2022/0149260 A1 May 12, 2022

Related U.S. Application Data

(63) Continuation of application No. PCT/JP2020/032632, filed on Aug. 28, 2020.

(30) Foreign Application Priority Data

Sep. 19, 2019 (JP) ................................ 2019-170655

(51) Int. Cl.

*H10N 10/17* (2023.01)
*H10N 10/82* (2023.01)
*H10N 10/01* (2023.01)

(52) U.S. Cl.

CPC ............. *H10N 10/17* (2023.02); *H10N 10/82* (2023.02); *H10N 10/01* (2023.02)

(58) Field of Classification Search

CPC ........ H10N 10/27; H10N 10/82; H10N 10/17; H10N 10/01

See application file for complete search history.

(56) References Cited

U.S. PATENT DOCUMENTS

2006/0042675 A1 3/2006 Tateyama et al.
2006/0118159 A1* 6/2006 Tsuneoka .............. H10N 10/81 136/211

(Continued)

FOREIGN PATENT DOCUMENTS

JP 2006049872 A 2/2006
JP 2007110082 A 4/2007

(Continued)

OTHER PUBLICATIONS

Office Action issued in Japanese Appln. No. 2021-546575 mailed Aug. 8, 2023. English machine translation provided.

(Continued)

*Primary Examiner* — Uyen M Tran

(74) *Attorney, Agent, or Firm* — ROSSI, KIMMS & McDOWELL LLP

(57) ABSTRACT

To provide a technique for sealing a plurality of thermoelectric elements in a thermoelectric conversion module. A thermoelectric conversion module includes a substrate, a plurality of second electrodes, a plurality of thermoelectric elements, a cover portion, and a pair of terminal electrodes. The substrate has an electrode surface on which a plurality of first electrodes are provided. The plurality of second electrodes face the plurality of first electrodes. The plurality of thermoelectric elements are disposed between the plurality of first electrodes and the plurality of second electrodes and include P-type thermoelectric elements and N-type thermoelectric elements alternately connected in series using the plurality of first electrodes and the plurality of second electrodes. The cover portion seals the plurality of second electrodes and the plurality of thermoelectric elements on the electrode surface. The pair of terminal electrodes are provided on the substrate and drawn outside the cover portion from a pair of first electrodes in the plurality (Continued)

of first electrodes, the pair of first electrodes constituting both ends of a series connection of the plurality of thermo-electric elements.

11 Claims, 7 Drawing Sheets

(56) References Cited

U.S. PATENT DOCUMENTS

| | | | | |
|---|---|---|---|---|
| 2007/0028955 | A1* | 2/2007 | Sogou | H05K 1/0204 136/200 |
| 2007/0095383 | A1* | 5/2007 | Tajima | H10N 10/01 136/238 |
| 2010/0101619 | A1 | 4/2010 | Sogou | |
| 2017/0345988 | A1* | 11/2017 | Kim | H05K 5/0213 |
| 2018/0083179 | A1 | 3/2018 | Yoshida | |
| 2018/0159015 | A1* | 6/2018 | Kasichainula | H02S 10/10 |
| 2018/0175269 | A1* | 6/2018 | Furukawa | H10N 10/17 |
| 2019/0081226 | A1* | 3/2019 | Hamano | H10N 10/17 |

FOREIGN PATENT DOCUMENTS

| | | | | | |
|---|---|---|---|---|---|
| JP | 2013191801 | A | | 9/2013 | |
| JP | 2018049886 | A | | 3/2018 | |
| KR | 1020060050778 | A | | 5/2006 | |
| KR | 20170061454 | A | * | 6/2017 | |
| WO | WO-2017179735 | A1 | * | 10/2017 | H01L 23/02 |

OTHER PUBLICATIONS

Office Action issued in Korean Appln. No. 10-2022-7000501, mailed Jul. 19, 2023. English machine translation provided.

International Search Report issued in Intl. Appln. No. PCT/JP2020/032632 mailed Nov. 17, 2020. English translation provided.

Written Opinion issued in Intl. Appln. No. PCT/JP2020/032632 mailed Nov. 17, 2020.

Office Action issued in Korean Appln. No. 10-2022-7000501 mailed Dec. 14, 2022. English machine translation provided.

Office Action issued in Japanese Appln. No. 2021-546575 mailed on Mar. 7, 2023. English machine translation provided.

Extended European Search Report issued in European Appln. No. 20866672.7, dated Sep. 1, 2023.

Office Action issued in Korean Appln. No. 10-2022-7000501 mailed on Jan. 29, 2024. English machine translation provided.

Reconsideration Report by Examiner before Appeal issued in Japanese Application No. 2021-546575 dated Jun. 25, 2024. English machine translation provided.

Communication Pursuant to Article 94(3) EPC issued in European Appln. No. 20866672.7 mailed Nov. 14, 2025.

First Examination Opinion Notice issued in Chinese Appln. No. 202080049211.8 mailed Jan. 15, 2026.

Second Office Action issued in Chinese Appln. No. 202080049211.8 mailed on Jun. 6, 2026.

* cited by examiner

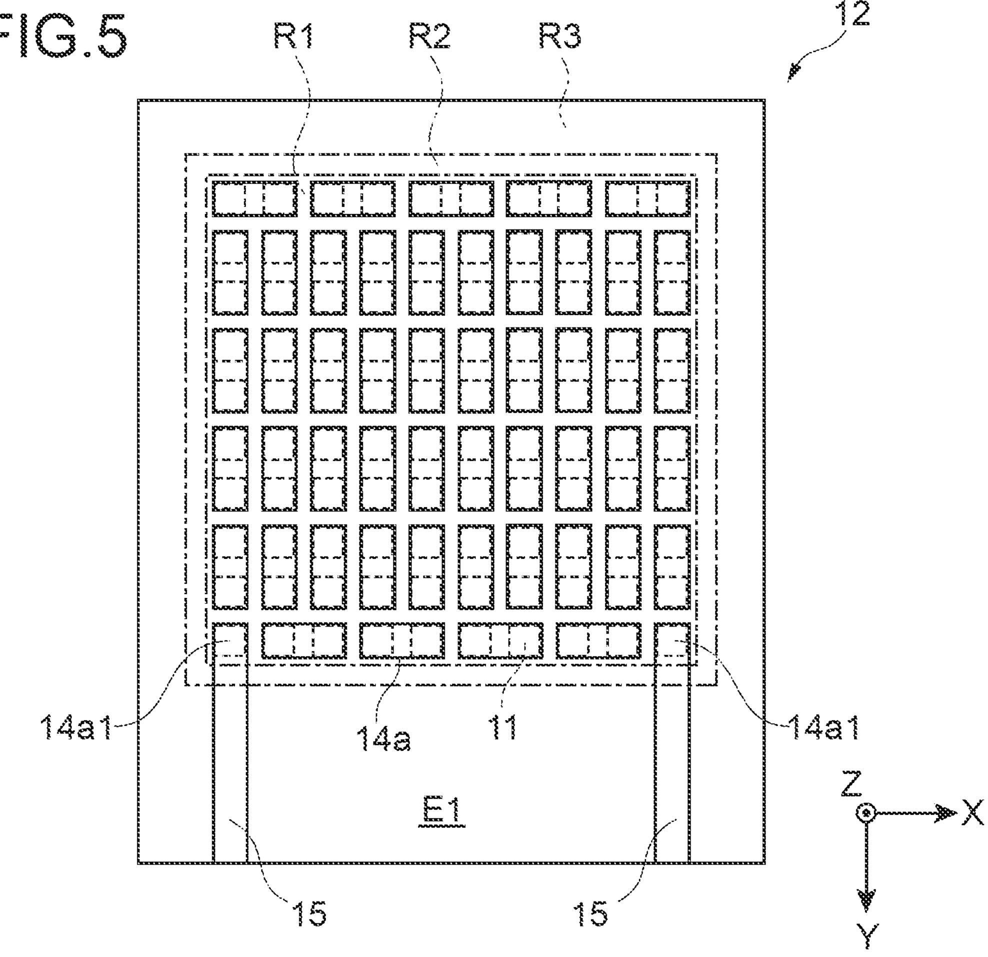
FIG.6
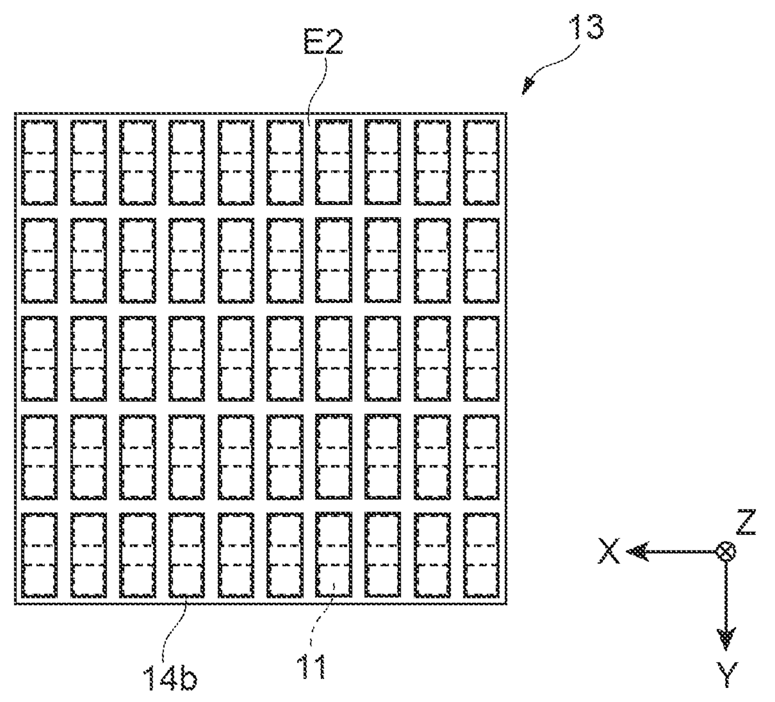

110
16
16a
13
18
14b
E2
16b
R3
R2
11
E1
115a 115b
14a1
14a
112a 112b
17
115
112
R1
Z
Y
X

THERMOELECTRIC CONVERSION MODULE

TECHNICAL FIELD

The present invention relates to a thermoelectric conversion module having excellent environmental resistance.

BACKGROUND ART

The thermoelectric conversion modules are available as cooling modules utilizing the Peltier effect of thermoelectric materials and as power generation modules utilizing the Seebeck effect of thermoelectric materials. With the expansion of applications of thermoelectric conversion modules and the like, the thermoelectric conversion modules have been more utilized in various environments. In the thermoelectric conversion modules, deterioration caused by the external environment, such as oxidation or corrosion, in thermoelectric elements formed of thermoelectric materials causes reduction in thermoelectric conversion performance.

Patent Literature 1 discloses a thermoelectric conversion module capable of preventing deterioration caused by the external environment in thermoelectric elements. The thermoelectric conversion module has a configuration that is hermetically covered with a package formed of a plate material of metal, and in which only a lead wire is drawn outside the package. In such a thermoelectric conversion module, excellent environmental resistance is obtained, because the thermoelectric elements in the package separated from the outside are not affected by the external environment.

CITATION LIST

Patent Literature

Patent Literature 1: Japanese Patent Application Laid-open No. 2006-49872

DISCLOSURE OF INVENTION

Technical Problem

However, in the thermoelectric conversion module according to the above document, both the lead wire and the package are formed of metal. So, this thermoelectric conversion module needs a configuration for electrically insulating the lead wire and the package from each other and for hermetically sealing a gap between the lead wire and the package. For that reason, in this thermoelectric conversion module, the manufacturing process is complicated and the manufacturing cost is increased.

In view of the above circumstances, it is an object of the present invention to provide a technique for sealing a plurality of thermoelectric elements in a thermoelectric conversion module.

Solution to Problem

To achieve the above object, a thermoelectric conversion module according to an embodiment of the present invention includes a substrate, a plurality of second electrodes, a plurality of thermoelectric elements, a cover portion, and a pair of terminal electrodes.

The substrate has an electrode surface on which a plurality of first electrodes are provided.

The plurality of second electrodes face the plurality of first electrodes.

The plurality of thermoelectric elements are disposed between the plurality of first electrodes and the plurality of second electrodes and include P-type thermoelectric elements and N-type thermoelectric elements alternately connected in series using the plurality of first electrodes and the plurality of second electrodes.

The cover portion seals the plurality of second electrodes and the plurality of thermoelectric elements on the electrode surface.

The pair of terminal electrodes are provided on the substrate and drawn outside the cover portion from a pair of first electrodes in the plurality of first electrodes, the pair of first electrodes constituting both ends of a series connection of the plurality of thermoelectric elements.

The substrate may include a first region in which the plurality of thermoelectric elements are disposed, a second region that surrounds the first region and to which the cover portion is bonded, and a third region outside the second region.

The pair of terminal electrodes may be drawn out from the first region to the third region via the second region.

The pair of terminal electrodes may be provided on the electrode surface and have a thickness of 100 μm or less.

The substrate may be configured as a layered substrate. In this case, each of the pair of terminal electrodes may include an interlayer electrode, and a through electrode that connects one of the pair of first electrodes and the interlayer electrode to each other.

Each of the pair of terminal electrodes may include a back electrode provided on a surface opposite to the electrode surface in the substrate, and a through electrode that connects one of the pair of first electrodes and the back electrode to each other.

The substrate may be configured as a resin substrate including a metal film provided on a surface opposite to the electrode surface.

The substrate may be a low-temperature-side substrate.

The thermoelectric conversion module may further include a fastening member that mechanically fixes the substrate and the cover portion to each other.

BRIEF DESCRIPTION OF DRAWINGS

FIG. 5 is a plan view of a first electrode surface of a first substrate of the thermoelectric conversion module.

FIG. 6 is a plan view of a second electrode surface of a second substrate of the thermoelectric conversion module.

MODE(S) FOR CARRYING OUT THE INVENTION

Figure 1:
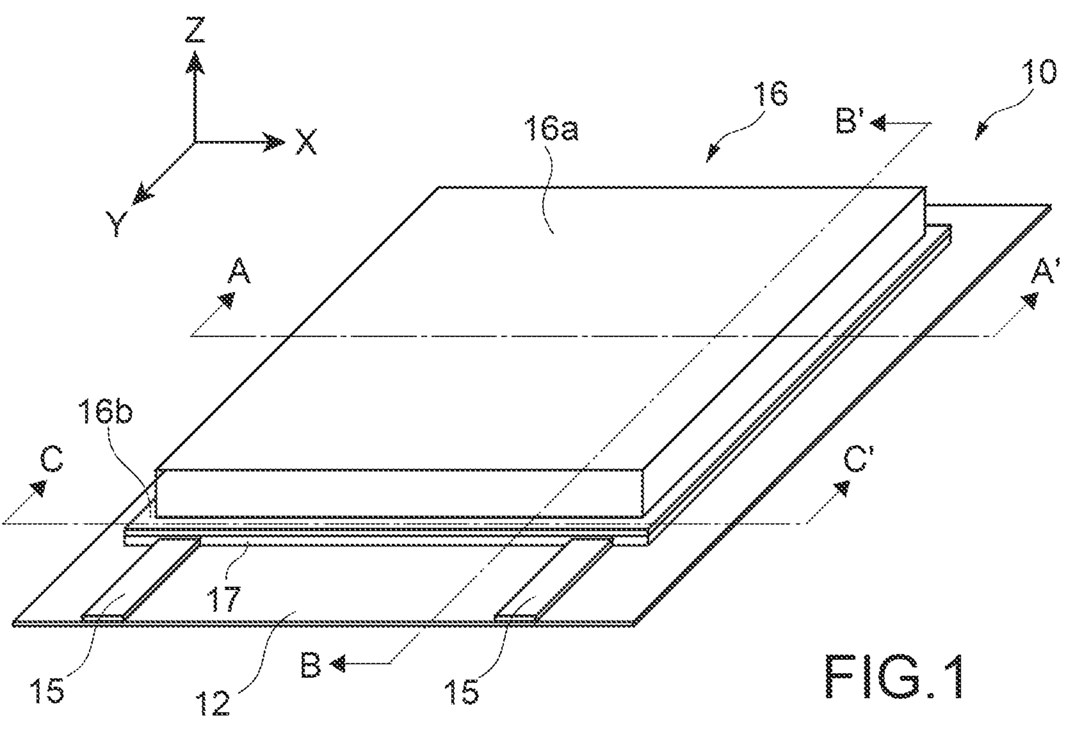
FIG. 1 is a perspective view of a thermoelectric conversion module according to a first embodiment of the present invention.

Hereinafter, embodiments of the present invention will be described with reference to the drawings.

The X-axis, the Y-axis, and the Z-axis, which are orthogonal to each other as appropriate, are shown in the drawings. The X-axis, the Y-axis, and the Z-axis are common in all figures.

First Embodiment

FIG. 1 is a perspective view of a thermoelectric conversion module 10 according to a first embodiment of the present invention. The thermoelectric conversion module 10 includes a first substrate 12 and a cover portion 16. The first substrate 12 is a rectangular flat plate extending along the X-axis and Y-axis directions and constitutes the lower surface of the thermoelectric conversion module 10 in the Z-axis direction. The cover portion 16 has a flat shape along the XY plane and covers the first substrate 12 from above in the Z-axis direction.

The cover portion 16 includes a housing portion 16*a* and a flange portion 16*b*. The housing portion 16*a* forms a rectangular inner space, which extends along the X-axis and Y-axis directions and is opened downward in the Z-axis direction. The flange portion 16*b* extends outward in the X-axis and Y-axis directions from the lower end portion of the housing portion 16*a*, which is opened in the Z-axis direction. The cover portion 16 is bonded to the first substrate 12 without a gap via a bonding member 17 over the entire circumference of the flange portion 16*b*.

The cover portion 16 includes the flange portion 16*b*, which makes it possible to ensure a large bonding area with respect to the first substrate 12 via the bonding member 17. Thus, in the cover portion 16, a gap is less likely to be generated between the flange portion 16*b* and the first substrate 12. From this viewpoint, the dimension of the flange portion 16*b* extending in the X-axis and the Y-axis directions from the housing portion 16*a* is favorably 1 mm or more, and more favorably 3 mm or more.

Figure 2:
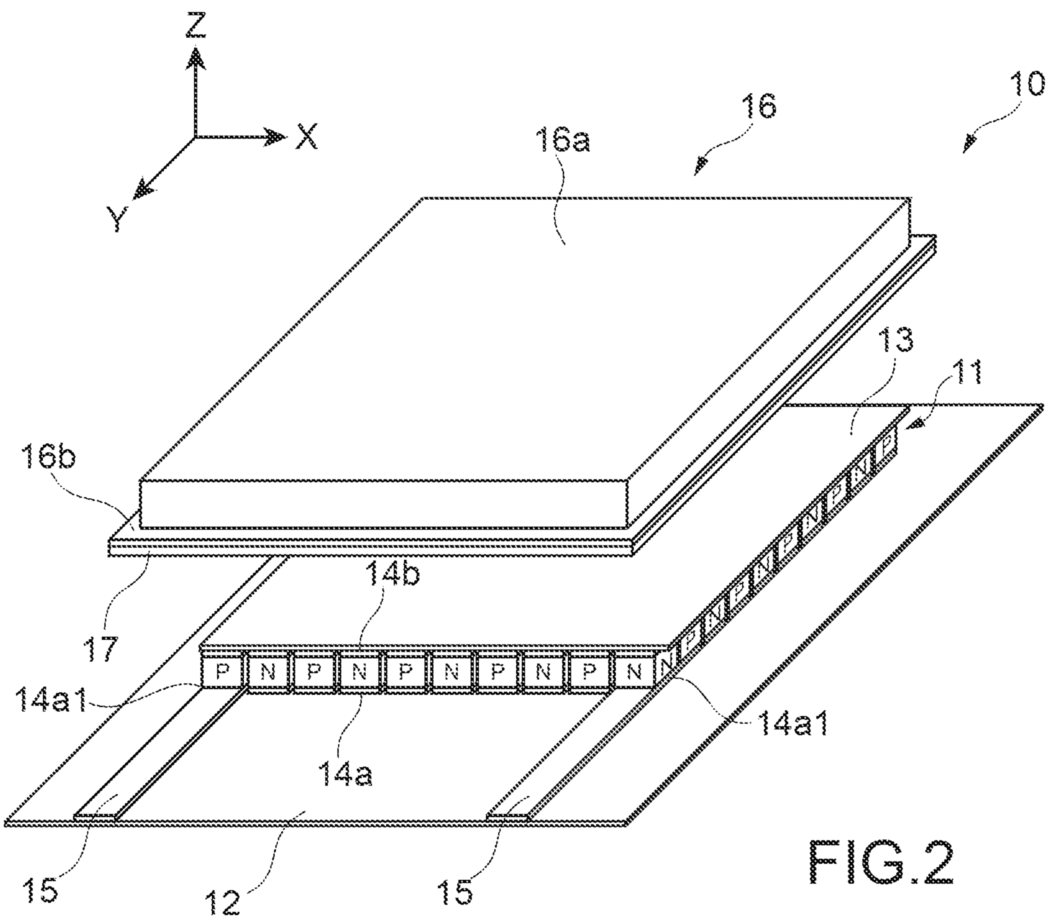
FIG. 2 is an exploded perspective view of the thermoelectric conversion module.
Figure 3:
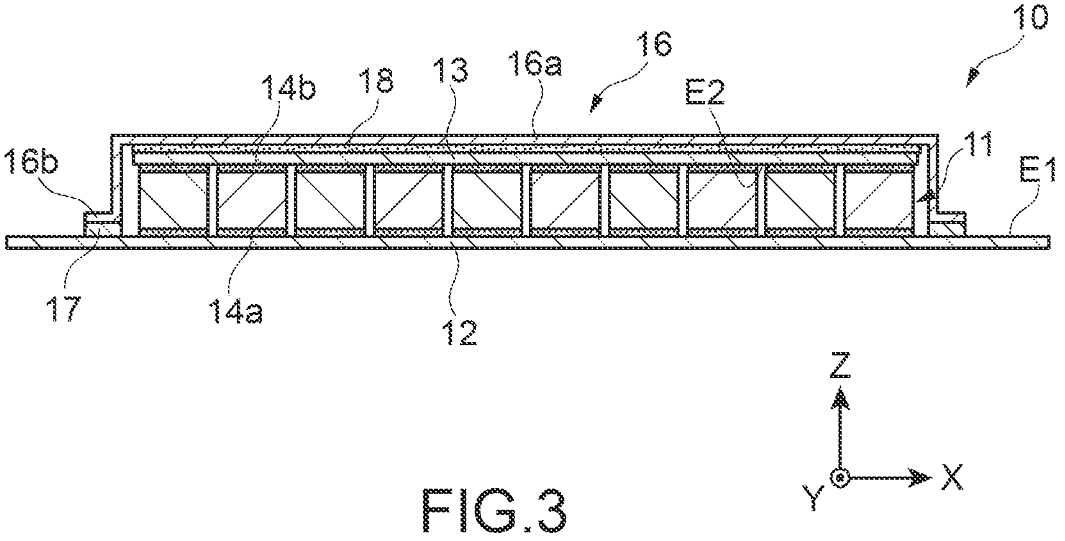
FIG. 3 is a cross-sectional view of the thermoelectric conversion module taken along the line A-A' of FIG. 1.
Figure 4:
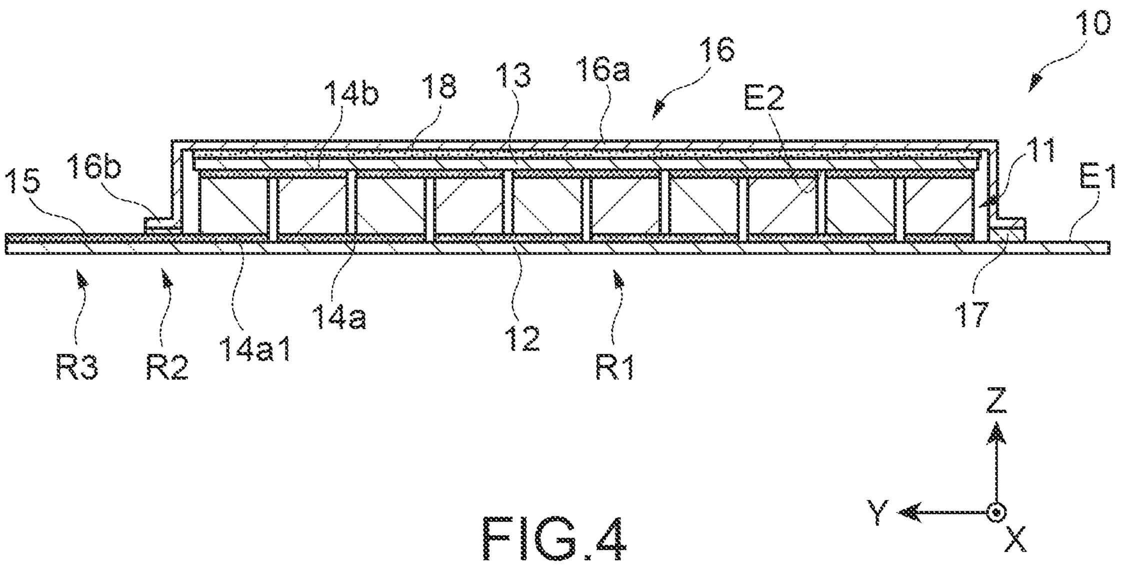
FIG. 4 is a cross-sectional view of the thermoelectric conversion module taken along the line B-B' of FIG. 1.

FIG. 2 is an exploded perspective view showing a state of the thermoelectric conversion module 10, in which the cover portion 16 bonded via the bonding member 17 is detached from the first substrate 12. FIG. 3 is a cross-sectional view of the thermoelectric conversion module 10 taken along the line A-A' of FIG. 1. FIG. 4 is a cross-sectional view of the thermoelectric conversion module 10 taken along the line B-B' of FIG. 1. Nota that, in the following description, the near side in the Y-axis direction is defined as the front side, and the deep side in the Y-axis direction is defined as the back side in FIGS. 1 and 2.

The thermoelectric conversion module 10 includes a plurality of thermoelectric elements 11 and a second substrate 13. The second substrate 13 is a rectangular flat plate having a smaller dimension in the X-axis and Y-axis directions than the first substrate 12, and is opposed to the central region along the XY plane in the first substrate 12 upward in the Z-axis direction. The plurality of thermoelectric elements 11 are arranged between the first substrate 12 and the second substrate 13. The cover portion 16 seals the second substrate 13 and the plurality of thermoelectric elements 11 in the housing portion 16*a*.

In the thermoelectric conversion module 10, the cover portion 16 has a protective function of sealing and protecting the plurality of thermoelectric elements 11 from the external environment. In other words, in the thermoelectric conversion module 10, since the plurality of thermoelectric elements 11 housed in the housing portion 16*a* are not affected by the outside separated by the cover portion 16, reduction in thermoelectric conversion performance due to deterioration of the plurality of thermoelectric elements 11 is hardly caused regardless of the use environment.

The cover portion 16 can be formed of any material, but it is favorable to be formed of a metal foil of aluminum, aluminum alloy, stainless steel, or the like. This provides the cover portion 16 with high heat resistance and corrosion resistance, so that it is possible to maintain the protective function of the plurality of thermoelectric elements 11 over a long period of time. Further, the cover portion 16 formed of a metal foil is less likely to inhibit the thermoelectric conversion performance of the thermoelectric conversion module 10 because of having the small thermal resistance. The thickness of the metal foil forming the cover portion 16 is favorably 100 μm or more and 250 μm or less, and more favorably 150 μm or more and 200 μm or less.

Furthermore, if the cover portion 16 is formed of a metal foil as described above, the weight of the thermoelectric conversion module 10 can be reduced. Further, since the cover portion 16 formed of a metal foil has flexibility, the load due to thermal expansion and thermal contraction of the cover portion 16 is hardly applied to the first substrate 12 during use of the thermoelectric conversion module 10. In addition to the above, if the cover portion 16 is formed of a metal foil, the raw material cost can be reduced.

The first substrate 12 and the second substrate 13 are each formed of an insulating material. For example, each of the first substrate 12 and the second substrate 13 can be a ceramic substrate, a resin substrate, a glass substrate, a glass epoxy substrate, or the like. Examples of the ceramic substrate include an aluminum nitride substrate and an aluminum oxide substrate. Further, in the thermoelectric conversion module 10, different types of substrates from each other may be used for the first substrate 12 and the second substrate 13.

The first substrate 12 is configured as, for example, a low-temperature-side substrate to be connected to a low-temperature-side heat exchanger, and has a first electrode surface E1 facing upward in the Z-axis direction. The second substrate 13 is configured as, for example, a high-temperature-side substrate to be connected to a high-temperature-side heat exchanger, and has a second electrode surface E2 facing downward in the Z-axis direction. A plurality of first electrodes 14*a* are arranged in a region of the first electrode surface E1 of the first substrate 12, the region facing the second electrode surface E2 of the second substrate 13. A plurality of second electrodes 14*b* are arranged on the second electrode surface E2 of the second substrate 13.

The first electrode 14*a* and the second electrode 14*b* can be formed of, for example, gold (Au), nickel (Ni), tin (Sn), copper (Cu), or an alloy thereof. The first electrode 14*a* and the second electrode 14*b* can have a single-layer structure or can have a multilayer structure in which a plurality of types of metal layers are combined. The first electrode 14*a* and the second electrode 14*b* can be formed by a plating method, but another method such as a direct bonding of copper (DBC) may be used.

As shown in FIGS. 3 and 4, it is favorable that the thermoelectric conversion module 10 include a heat transfer layer 18 provided between the second substrate 13 and the cover portion 16. The heat transfer layer 18 is in close contact with both the second substrate 13 and the cover portion 16. The heat transfer layer 18 has an action of reducing the thermal resistance between the cover portion 16 and the second substrate 13. The heat transfer layer 18 can be formed of, for example, silicon grease, a graphite sheet, or a thermally conductive adhesive.

The plurality of thermoelectric elements 11 are formed of P-type thermoelectric elements and N-type thermoelectric elements. The P-type thermoelectric elements and the N-type thermoelectric elements in the plurality of thermoelectric elements 11 are alternately arranged along the X-axis direction and the Y-axis direction between the first substrate 12 and the second substrate 13. The plurality of thermoelectric elements 11 are bonded to the first electrodes 14*a* and the second electrodes 14*b* by, for example, a known bonding material such as solder, a brazing material, or an electrically conductive paste.

FIG. 5 is a plan view showing the first electrode surface E1 of the first substrate 12. FIG. 6 is a plan view showing the second electrode surface E2 of the second substrate 13. Note that FIGS. 5 and 6 show the positions of the plurality of thermoelectric elements 11 by broken lines. The first electrodes 14*a* of the first substrate 12 and the second electrodes 14*b* of the second substrate 13 are patterned so as to alternately connect in series all the P-type thermoelements and the N-type thermoelectric elements that constitute the plurality of thermoelectric elements 11.

The plurality of thermoelectric elements 11 are each formed of a thermoelectric material, that is, the P-type thermoelectric element is formed of a P-type thermoelectric material, and the N-type thermoelectric element is formed of an N-type thermoelectric material. The plurality of thermoelectric elements 11 may be formed of, for example, a bismuth-tellurium-based thermoelectric material, a half-Heusler-based thermoelectric material, a silicide-based thermoelectric material, a lead-tellurium-based thermoelectric material, a silicon-germanium-based thermoelectric material, a skutterudite-based thermoelectric material, or a tetrahedrite-based thermoelectric material.

The plurality of first electrodes 14*a* on the first substrate 12 include a pair of first electrodes 14*a*1 disposed at two corners on the front side in the Y-axis direction. The pair of first electrodes 14*a*1 constitute both ends of a series connection of the plurality of thermoelectric elements 11. The first substrate 12 includes a pair of terminal electrodes 15 respectively drawn out from the pair of first electrodes 14*a*1 to the front end in the Y-axis direction. The pair of terminal electrodes 15 can be formed integrally with the pair of first electrodes 14*a*1.

As shown in FIG. 5, the first substrate 12 can be divided into three regions along the XY plane, that is, a first region R1, a second region R2, and a third region R3. The first region R1 is a region that is disposed at the center of the first substrate 12 in the X-axis direction and the Y-axis direction and closes the housing portion 16*a* of the cover portion 16. In other words, the second substrate 13 and the plurality of thermoelectric elements 11 are held on the first electrode surface E1 in the first region R1.

The second region R2 of the first substrate 12 is a region that surrounds the periphery of the first region R1 and faces the flange portion 16*b* of the cover portion 16. In other words, the flange portion 16*b* of the cover portion 16 is bonded to the first electrode surface E1 in the second region R2 via the bonding member 17. The third region R3 of the first substrate 12 is a region outside the second region R2. In other words, the first electrode surface E1 is exposed to the external space in the third region R3.

Figure 7:
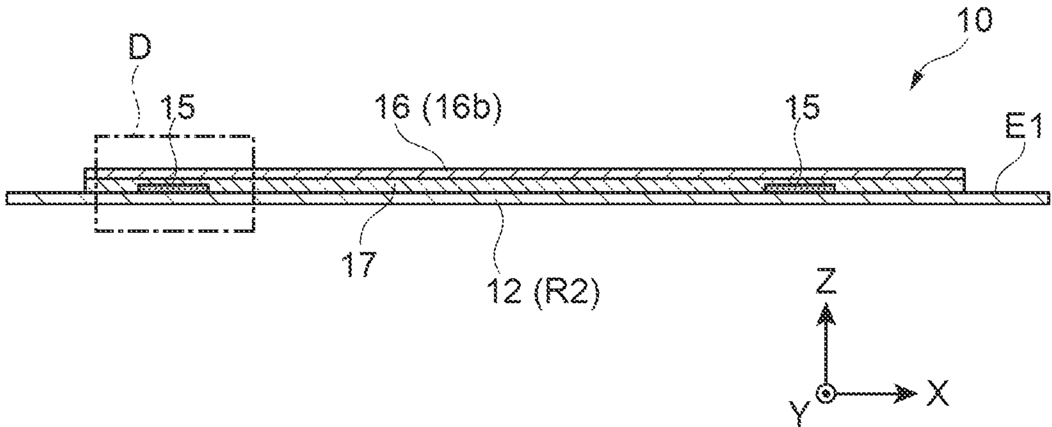
FIG. 7 is a cross-sectional view of the thermoelectric conversion module taken along the line C-C' of FIG. 1.

As shown in FIG. 5, the pair of terminal electrodes 15 extend from the first region R1, in which the pair of first electrodes 14*a*1 are arranged, to the third region R3 via the second region R2. In the thermoelectric conversion module 10, the pair of terminal electrodes 15 can be used as terminals in the third region R3. FIG. 7 is a cross-sectional view of the thermoelectric conversion module 10 taken along the line C-C' of FIG. 1, that is, shows a cross-section of a portion through which the pair of terminal electrodes 15 pass in the second region R2.

Figure 8:
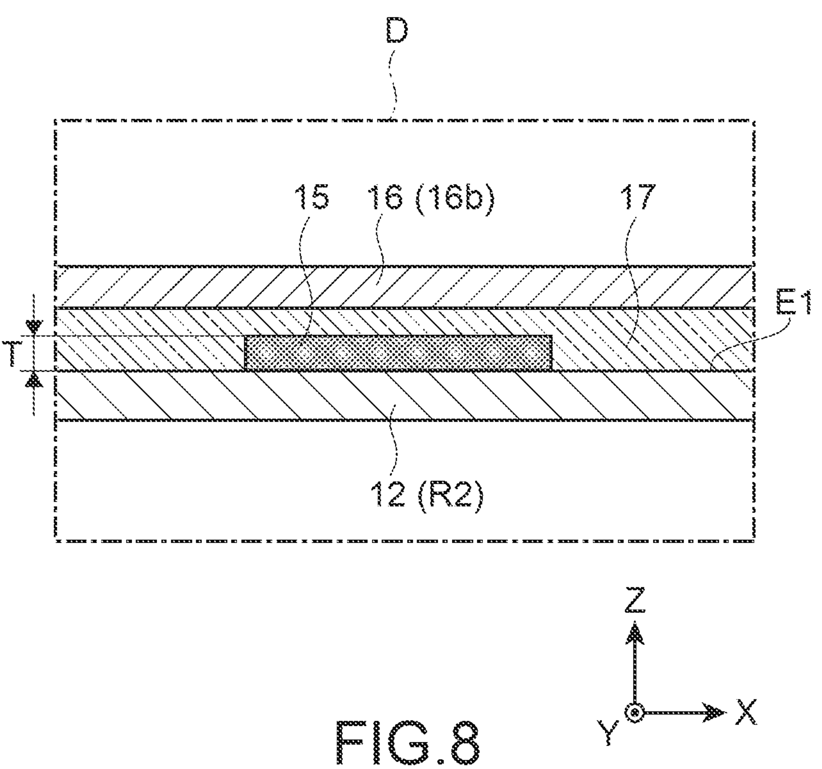
FIG. 8 is a partial cross-sectional view of the thermoelectric conversion module showing an enlarged region D of FIG. 7.

As shown in FIG. 7, the pair of terminal electrodes 15 penetrate the bonding member 17 in the Y-axis direction in the second region R2. FIG. 8 is a view showing an enlarged region D of FIG. 7, which includes the terminal electrode 15 and its periphery and is surrounded by a chain line. In the thermoelectric conversion module 10, the bonding member 17 is sandwiched between the first electrode surface E1 and the flange portion 16*b*, so that it is possible to bring the bonding member 17 into close contact with a region in which the terminal electrode 15 is not held on the first electrode surface E1 of the first substrate 12.

FIG. 8 shows a thickness T that is the dimension of the terminal electrode 15 in the Z-axis direction. In the first substrate 12, as the thickness T of the terminal electrode 15 becomes larger, the bonding member 17 is less likely to come into close contact along the step formed on the first electrode surface E1 due to the terminal electrode 15, and thus a gap is likely to be generated between the terminal electrode 15 and the bonding member 17. From this viewpoint, in the first substrate 12, it is favorable that the thickness T of the pair of terminal electrodes 15 be kept to 100 μm or less, and further 75 μm or less.

The bonding member 17 can be selected as appropriate from insulating materials having physical properties such as viscosity suitable for coming into close contact with the pair of terminal electrodes 15 without a gap in an uncured state. As such insulating materials, for example, a polyolefin-based resin, an epoxy resin, a polyimide resin, a urethane resin, an acrylic resin, or the like can be selected as appropriate. Further, the thickness of the bonding member 17 can be determined as appropriate in accordance with the thickness T of the pair of terminal electrodes 15.

In the manufacturing process of the thermoelectric conversion module 10, in the process of bonding the flange portion 16*b* of the cover portion 16 onto the first electrode surface E1 of the first substrate 12 via the bonding member 17, the bonding member 17 can be brought into close contact with the pair of terminal electrodes 15 without a gap. Therefore, the thermoelectric conversion module 10 does not require a special process for ensuring insulation and airtightness around the pair of terminal electrodes 15.

Further, in the thermoelectric conversion module 10, the first substrate 12, which is a low-temperature-side substrate, also has a function of closing, from below in the Z-axis direction, the housing portion 16*a* of the cover portion 16 for sealing the plurality of thermoelectric elements 11. Thus, the thermoelectric conversion module 10 does not need to separately include a member for closing the housing portion

16*a* from below in the Z-axis direction. Therefore, it is possible to reduce the manufacturing cost in the thermoelectric conversion module 10.

Furthermore, in the thermoelectric conversion module 10, the lower surface of the first substrate 12 in the Z-axis direction is exposed to the external space, unlike the configuration in which the entire periphery is covered by a package. Therefore, in the thermoelectric conversion module 10, it is possible to seal the plurality of thermoelectric elements 11 without increasing the thermal resistance at the low-temperature side. Thus, in the thermoelectric conversion module 10, it is possible to achieve high environmental resistance while ensuring high thermoelectric conversion performance.

Of course, the configuration of the thermoelectric conversion module 10 described above can be variously modified in accordance with the required thermoelectric conversion performance or the like. For example, in the thermoelectric conversion module 10, the number and arrangement of the plurality of thermoelectric elements 11, the shape of the first substrate 12 and the second substrate 13, and the like can be changed from the above configuration. Further, in the thermoelectric conversion module 10, the second substrate 13 may be divided into a plurality of pieces. In the second substrate 13 having such a configuration, particularly in the case of a ceramic substrate, the amount of deformation caused by warpage due to the influence of heat can be kept small.

Figure 9:
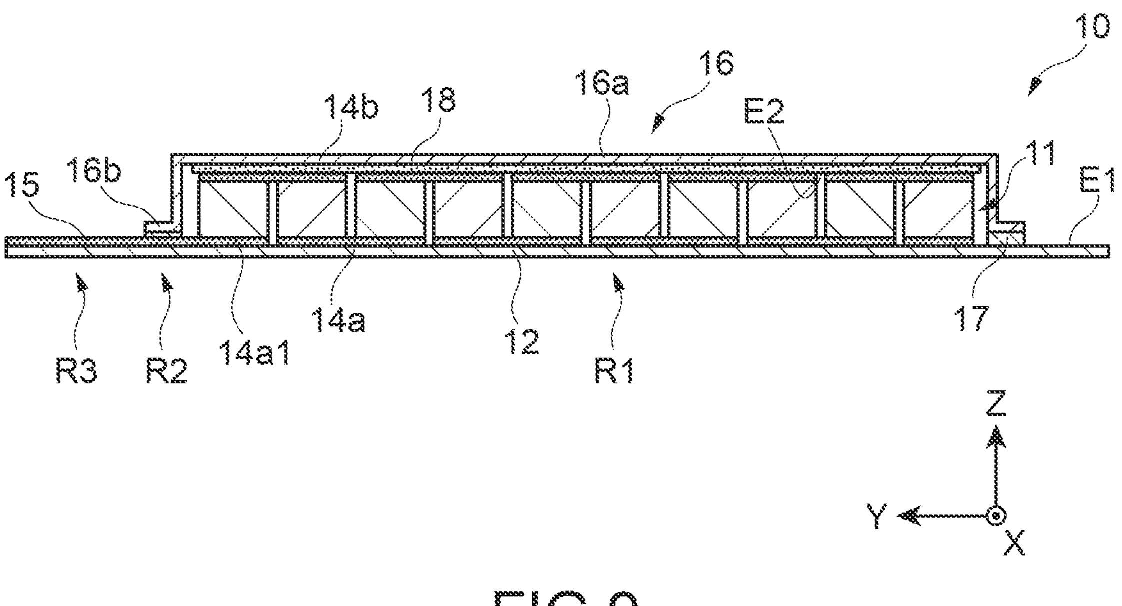
FIG. 9 is a cross-sectional view of a modification of the thermoelectric conversion module.

Furthermore, in the thermoelectric conversion module 10, as shown in FIG. 9, the second substrate 13 may be omitted, and the second electrodes 14*b* may be connected to the cover portion 16 via the heat transfer layer 18. Insulation between the second electrodes 14*b* in this configuration can be achieved by, for example, a configuration in which the heat transfer layer 18 is formed of an insulating material, or a configuration in which an insulating layer different from the second substrate 13 is provided between the second electrodes 14*b* and the heat transfer layer 18.

As the second electrodes 14*b* of the thermoelectric conversion module 10 without using the second substrate 13 shown in FIG. 9, for example, a plurality of copper pieces formed of a copper foil can be used. The copper piece can be formed into the shape of the second electrode 14*b* by, for example, pressing or etching. Further, for positioning of the plurality of copper pieces, for example, a jig formed to correspond to a designated position in the design of the second electrode 14*b* can be used.

Figure 10:
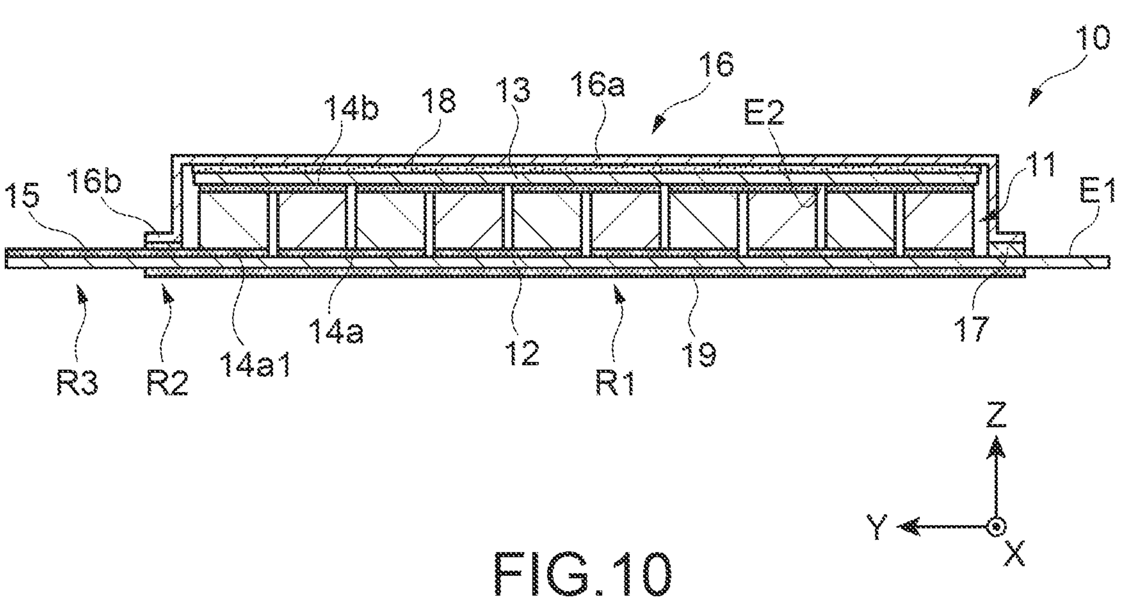
FIG. 10 is a cross-sectional view of a modification of the thermoelectric conversion module.

Further, when a resin substrate is used as the first substrate 12 in the thermoelectric conversion module 10, as shown in FIG. 10, it is favorable to provide a metal film 19 formed of a metal material such as copper on the lower surface of the first substrate 12 in the Z-axis direction, which is opposite to the first electrode surface E1. As a result, it is possible to prevent water vapor, oxygen, or the like from the outside from passing through the first substrate 12 formed of resin and entering the housing portion 16*a* of the cover portion 16.

In this configuration, the metal film 19 only needs to be formed on at least a part of the first region R1 of the first substrate 12. However, it is favorable that the metal film 19 be formed over the entire first region R1 of the first substrate 12, and further favorable that the metal film extend from the first region R1 to the second region R2. In addition, the metal film 19 may be formed over the entire region of the lower surface of the first substrate 12 in the Z-axis direction without patterning.

Further, in the thermoelectric conversion module 10, it is favorable that the inside of the housing portion 16*a* of the cover portion 16 be a non-oxidizing atmosphere or a reduced-pressure atmosphere in which the amount of oxygen is smaller than in the atmosphere. Thus, it is possible to prevent an increase in the electrical resistance of the thermoelectric conversion module 10 due to oxidation of the plurality of thermoelectric elements 11. The non-oxidizing atmosphere can be generated by, for example, encapsulation of an inert gas such as nitrogen or argon.

Second Embodiment

Figures 11, 12:
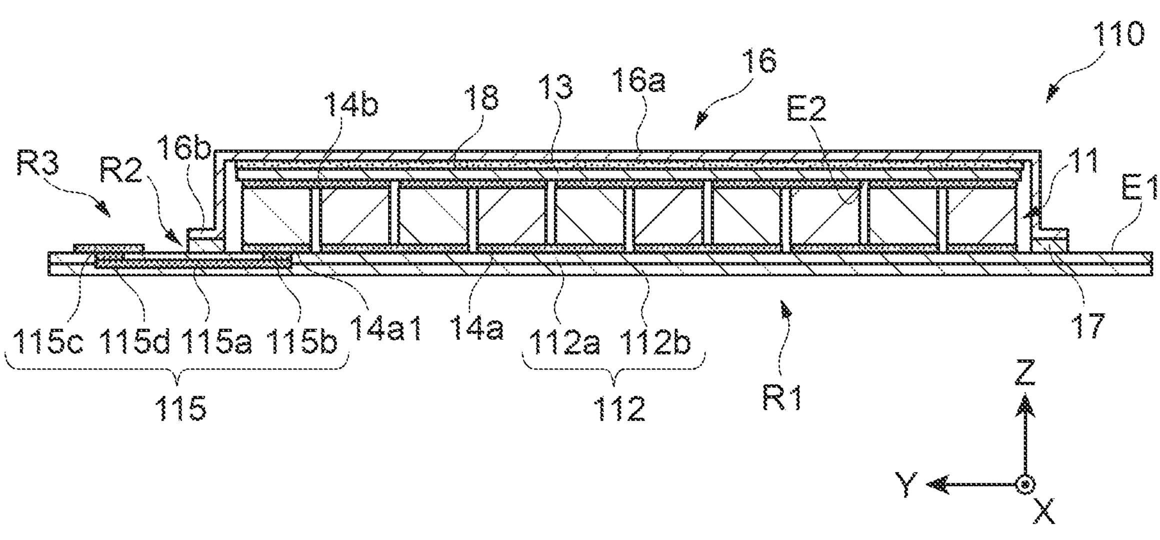
FIG. 11 is a cross-sectional view of a thermoelectric conversion module according to a second embodiment of the present invention.
FIG. 12 is a cross-sectional view of a modification of the thermoelectric conversion module.

FIG. 11 is a cross-sectional view of a thermoelectric conversion module 110 according to a second embodiment of the present invention. In the thermoelectric conversion module 110, the configuration of a first substrate 112 is different from that of the first substrate 12 of the thermoelectric conversion module 10 according to the first embodiment, and the configuration other than the first substrate 112 is common to the thermoelectric conversion module 10 according to the first embodiment. In this embodiment, the same reference numerals are used for the components similar to those of the first embodiment, and the description thereof is omitted as appropriate.

In the thermoelectric conversion module 110, the first substrate 112 is configured as a layered substrate having a multilayer structure including an inner layer 112*a* and an outer layer 112*b* stacked in the Z-axis direction. The first substrate 112 includes a terminal electrode 115 including an interlayer electrode 115*a* disposed between the inner layer 112*a* and the outer layer 112*b*. In addition to the interlayer electrode 115*a*, the terminal electrode 115 includes a first through electrode 115*b*, an electrode pad 115*c*, and a second through electrode 115*d*.

The first through electrode 115*b* penetrates the inner layer 112*a* in the first region R1, and connects a first electrode 14*a*1 and the interlayer electrode 115*a* to each other. The electrode pad 115*c* is provided on the first electrode surface E1 in the third region R3. The second through electrode 115*d* connects the electrode pad 115*c* and the interlayer electrode 115*a* to each other. Thus, in the thermoelectric conversion module 110, the electrode pad 115*c* on the first electrode surface E1 can be used as a terminal.

The first substrate 112 is provided as the layered substrate and can thus have a configuration that does not cause a step due to the terminal electrode 115 on the first electrode surface E1 in the second region R2. Thus, in the first substrate 112, it is easy to ensure airtightness between the first electrode surface E1 and the flange portion 16*b* of the cover portion 16. Note that the first substrate 112, which is a layered substrate, may be configured as a general multilayer wiring substrate and may include three or more layers.

Further, in the thermoelectric conversion module 110, the electrode pad 115*c* and the second through electrode 115*d* are not essential. For example, in the thermoelectric conversion module 110, as shown in FIG. 12, the interlayer electrode 115*a* can be exposed by shortening the inner layer 112*a* in the Y-axis direction in the third region R3 of the first substrate 112. In this case, the thermoelectric conversion module 110 can use the interlayer electrode 115*a* on the outer layer 112*b* as a terminal.

Third Embodiment

Figure 13:
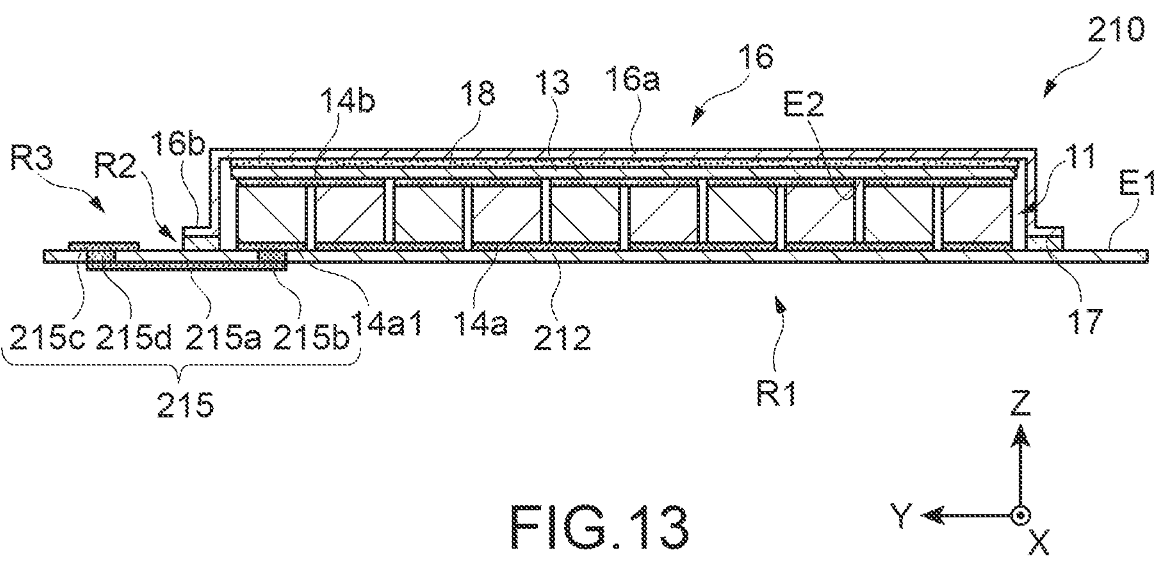
FIG. 13 is a cross-sectional view of a thermoelectric conversion module according to a third embodiment of the present invention.

FIG. 13 is a cross-sectional view of a thermoelectric conversion module 210 according to a third embodiment of the present invention. In the thermoelectric conversion module 210, the configuration of a first substrate 212 is different from that of the first substrate 12 of the thermoelectric conversion module 10 according to the first embodiment, and the configuration other than the first substrate 212 is common to the thermoelectric conversion module 10 according to the first embodiment. In this embodiment, the same reference numerals are used for the components similar to those of the first embodiment, and the description thereof is omitted as appropriate.

In the thermoelectric conversion module 210, the first substrate 212 has a single-layer structure similarly to the first substrate 12 according to the first embodiment. The first substrate 212 includes a terminal electrode 215 including a back electrode 215*a* on a lower surface of the first substrate 212 in the Z-axis direction, which is opposite to the first electrode surface E1. In addition to the back electrode 215*a*, the terminal electrode 215 includes a first through electrode 215*b*, an electrode pad 215*c*, and a second through electrode 215*d*.

The first through electrode 215*b* penetrates the base material of the first substrate 212 in the Z-axis direction in the first region R1, and connects a first electrode 14*a*1 and the back electrode 215*a* to each other. The electrode pad 215*c* is provided on the first electrode surface E1 in the third region R3. The second through electrode 215*d* connects the electrode pad 215*c* and the back electrode 215*a* to each other. Thus, in the thermoelectric conversion module 210, the electrode pad 215*c* on the first electrode surface E1 can be used as a terminal.

Similarly to the first substrate 112 of the thermoelectric conversion module 110 according to the second embodiment, the first substrate 212 of the thermoelectric conversion module 210 according to this embodiment can also have a configuration that does not cause a step due to the terminal electrode 215 on the first electrode surface E1 in the second region R2. Thus, similarly to the above, it is easy to ensure airtightness between the first electrode surface E1 and the flange portion 16*b* of the cover portion 16 also in the first substrate 212.

Figure 14:
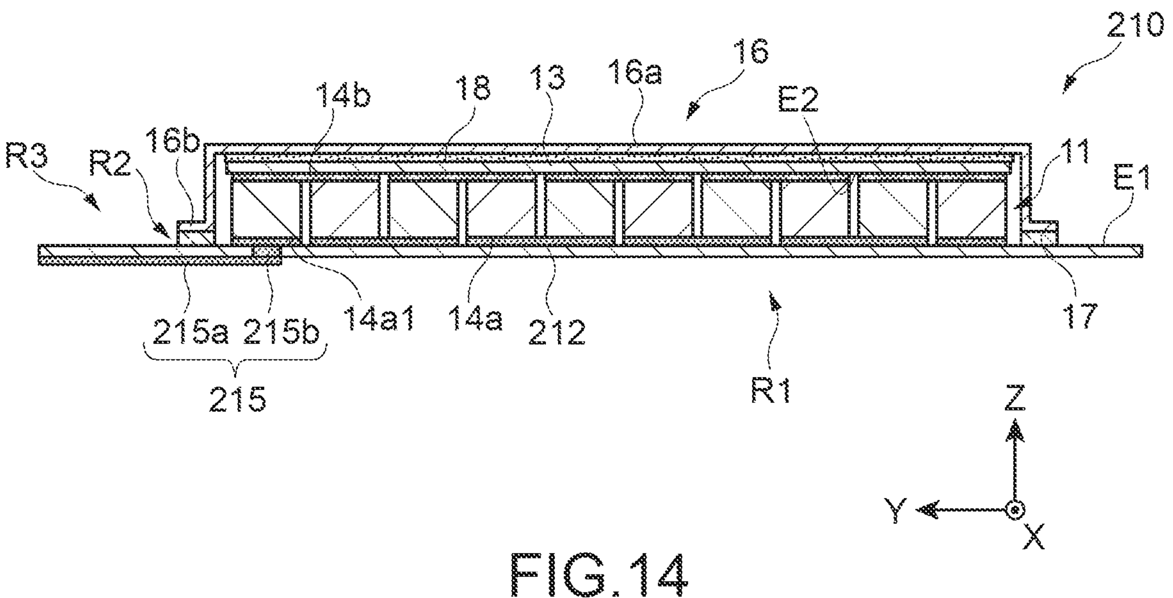
FIG. 14 is a cross-sectional view of a modification of the thermoelectric conversion module.

Further, in the thermoelectric conversion module 210, the electrode pad 215*c* and the second through electrode 215*d* are not essential. In other words, as shown in FIG. 14, the thermoelectric conversion module 210 may have a configuration in which the electrode pad 215*c* and the second through electrode 215*d* are omitted. In this case, in the thermoelectric conversion module 210, the back surface electrode 215*a* on the lower surface in the Z-axis direction, which is opposite to the first electrode surface E1 of the first substrate 212, can be used as a terminal.

OTHER EMBODIMENTS

Hereinabove, the embodiments of the present invention have been described, but the present invention is not limited to the embodiments described above and can be variously modified without departing from the gist of the present invention.

For example, in the above embodiments, the configuration including a single layer in which a plurality of thermoelectric elements are arranged has been described, but the thermoelectric conversion module according to the present invention may have a multistage configuration including a plurality of layers in each of which a plurality of thermoelectric elements are arranged. Further, in the above embodiments, the configuration including a single cover portion has been described, but the thermoelectric conversion module according to the present invention may include a cover portion divided into a plurality of portions on a first electrode surface of a single first substrate.

Further, in the present invention, the method of fixing the cover portion 16 to the first electrode surface E1 of the first substrate 12 is not limited to the configuration using the bonding member 17. The present invention can be configured by using, for example, a fastening member that mechanically fixes the cover portion 16 and the first substrate 12 to each other. As the fastening member, for example, a clip member can be used. In this case, by sandwiching the flange portion 16*b* of the cover portion 16 and the first substrate 12 from the outside by using a clip member, it is possible to mechanically fix the cover portion 16 to the first electrode surface E1 of the first substrate 12. Note that the bonding member 17 and the fastening member may be used in combination to fix the cover portion 16 to the first electrode surface E1 of the first substrate 12.

REFERENCE SIGNS LIST

10 thermoelectric conversion module
11 thermoelectric element
12 first substrate
13 second substrate
14*a*, 14*a*1 first electrode
14*b* second electrode
15 terminal electrode
16 cover portion
16*a* housing portion
16*b* flange portion
17 bonding member
18 heat transfer layer
19 metal film
E1 first electrode surface
E2 second electrode surface
R1 first region
R2 second region
R3 third region

The invention claimed is:

1. A thermoelectric conversion module, comprising:

an insulating substrate including an electrode surface on which a plurality of first electrodes are directly disposed, the insulating substrate being a single layer structure;

a plurality of second electrodes facing the plurality of first electrodes;

a plurality of thermoelectric elements respectively disposed between the plurality of first electrodes and the plurality of second electrodes and including P-type thermoelectric elements and N-type thermoelectric elements alternately connected in series by the plurality of first electrodes and the plurality of second electrodes;

a cover portion that seals the plurality of second electrodes and the plurality of thermoelectric elements on the electrode surface of the insulating substrate, the cover portion including a housing portion integrally formed with a flange portion, the housing portion extending to a first height above the insulating substrate, and the flange portion extending to a second height lower than the first height above the insulating substrate;

a bonding member formed of a resin and bonding the electrode surface of the insulating substrate and the flange portion of the cover portion to each other in an airtight manner; and a pair of terminal electrodes disposed directly on the electrode surface of the insulating substrate and respectively extending from a pair of first electrodes, among the plurality of first electrodes, through the bonding member to outside the cover portion such that the pair of terminal electrodes are disposed directly on the electrode surface of the insulating substrate outside the cover portion, the pair of first electrodes constituting both ends of the series connection of the plurality of thermoelectric elements, wherein:

the bonding member is disposed directly on both of the electrode surface of the insulating substrate and the pair of terminal electrodes only, and the flange portion of the cover portion, integrally formed with the housing portion of the cover portion, is disposed directly on the bonding member that is disposed directly on both of the electrode surface of the insulating substrate and the pair of terminal electrodes only.

2. The thermoelectric conversion module according to claim 1, wherein the insulating substrate includes:

a first region in which the plurality of thermoelectric elements are disposed, a second region that surrounds the first region and to which the flange portion of the cover portion is bonded, and a third region outside the second region, and wherein each terminal electrode of the pair of terminal electrodes extends from the first region to the third region via the second region.

3. The thermoelectric conversion module according to claim 2, wherein each terminal electrode of the pair of terminal electrodes has a thickness of 100 μm or less.

4. The thermoelectric conversion module according to claim 2, wherein:

each terminal electrode of the pair of terminal electrodes includes an interlayer electrode and a through electrode that connects one first electrode of the pair of first electrodes and the interlayer electrode to each other.

5. The thermoelectric conversion module according to claim 2, wherein:

the insulating substrate further includes a back electrode surface disposed opposite across a thickness of the insulating substrate from the electrode surface, and each terminal electrode of the pair of terminal electrodes includes a back electrode disposed on the back electrode surface and a through electrode that connects one first electrode of the pair of first electrodes and the back electrode to each other.

6. The thermoelectric conversion module according to claim 2, wherein:

the insulating substrate further includes a back surface disposed opposite across a thickness of the insulating substrate from the electrode surface, and the insulating substrate is a resin substrate and a metal film is disposed on the back surface of the insulating substrate.

7. The thermoelectric conversion module according to claim 1, wherein the insulating substrate is a low-temperature-side substrate of the thermoelectric conversion module.

8. The thermoelectric conversion module according to claim 1, further comprising a fastening member that mechanically fixes the insulating substrate and the cover portion to each other.

9. The thermoelectric conversion module according to claim 1, wherein a thickness of the bonding member exceeds a thickness of each terminal electrode of the pair of terminal electrodes.

10. The thermoelectric conversion module according to claim 1, wherein the cover portion is formed of a flexible metal foil having a thickness in a range of 100 μm or more to 250 μm or less.

11. The thermoelectric conversion module according to claim 1, wherein the cover portion is formed of a flexible metal foil having a thickness of 250 μm or less.

* * * * *